(12) United States Patent
Opitz

(10) Patent No.: US 10,103,929 B2
(45) Date of Patent: Oct. 16, 2018

(54) SYSTEM AND METHOD FOR TRANSMITTING DATA WITH USEFUL SIGNAL DETECTION AT THE RECEIVER END

(71) Applicant: Continental Automotive GmbH, Hannover (DE)

(72) Inventor: Martin Opitz, Regensburg (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 253 days.

(21) Appl. No.: 15/029,801

(22) PCT Filed: Sep. 30, 2014

(86) PCT No.: PCT/EP2014/070866
§ 371 (c)(1),
(2) Date: Apr. 15, 2016

(87) PCT Pub. No.: WO2015/055418
PCT Pub. Date: Apr. 23, 2015

(65) Prior Publication Data
US 2016/0241426 A1    Aug. 18, 2016

(30) Foreign Application Priority Data

Oct. 15, 2013 (DE) ........................ 10 2013 220 912

(51) Int. Cl.
*H04L 27/38* (2006.01)
*H04B 1/707* (2011.01)
(Continued)

(52) U.S. Cl.
CPC ......... *H04L 27/3827* (2013.01); *H03D 3/003* (2013.01); *H04B 1/707* (2013.01);
(Continued)

(58) Field of Classification Search
CPC .......... H04L 2027/0067; H04L 27/066; H04L 27/3827; H04L 2027/0042; H04L 27/2657;
(Continued)

(56) References Cited

U.S. PATENT DOCUMENTS 6,337,855 B1    1/2002    Malkamaki .................... 370/347
6,614,853 B1    9/2003    Koslar et al. .................. 375/271
(Continued)

FOREIGN PATENT DOCUMENTS

DE    19820836 A1    8/2000    ............... H04B 1/69
DE    10224284 A1    12/2003    ............. B60R 25/20
(Continued)

OTHER PUBLICATIONS

Sadr, Ramin et al., "Generalized Minimum Shift-Keying Modulation Techniques," IEEE Transactions on Communications, vol. 36, No. 1, pp. 32-40 (9 pages), Jan. 1988.
(Continued)

*Primary Examiner* — Rahel Guarino
(74) *Attorney, Agent, or Firm* — Slayden Grubert Beard PLLC

(57) ABSTRACT

The present disclosure teaches methods for digitally transmitting data. An example method may include: receiving a modulated signal containing at least one useful signal or noise or interference signals; repeatedly estimating at least one parameter of the received signal relevant to the demodulation of the useful signal; monitoring changes in the repeatedly estimated parameters; and detecting a useful signal based at least in part on whether one or more changes in the repeatedly estimated parameters satisfy at least one particular, predefined condition.

12 Claims, 5 Drawing Sheets

(51) Int. Cl.
*H04L 27/227* (2006.01)
*H04L 27/233* (2006.01)
*H03D 3/00* (2006.01)
*H04L 27/00* (2006.01)

(52) U.S. Cl.
CPC ........ *H04L 27/227* (2013.01); *H04L 27/2278* (2013.01); *H04L 27/233* (2013.01); *H04L 27/3854* (2013.01); *H04L 2027/003* (2013.01)

(58) Field of Classification Search
CPC ....... H04L 2025/03414; H04L 27/2601; H04L 27/34; H04L 2027/0026; H04L 2027/0065; H04L 1/0047; H04L 27/38; H04L 27/2271; H04L 27/3818; H04L 7/033; H04L 2027/0044; H04L 27/18; H04L 2025/03401; H04L 2027/0022; H04L 25/03292; H04L 25/063; H04L 27/2278; H04L 27/06; H04B 1/7075; H04B 1/7087; H04B 2201/70716; H04B 2201/70728; H04B 2201/7073; H04B 15/00; H04B 17/24; H04B 17/318; H04B 17/309; H04B 1/7077; H04B 7/216; H04W 72/085; H04W 56/0035; G01S 19/30; G01S 19/24; G01S 19/29; G01S 19/04; G01S 19/44; G01S 3/02
See application file for complete search history.

(56) References Cited

U.S. PATENT DOCUMENTS

| | | | |
|---|---|---|---|
| 7,035,352 B1 | 4/2006 | Malone et al. | 375/334 |
| 8,971,385 B2 | 3/2015 | Opitz | 375/148 |
| 2006/0154613 A1 | 7/2006 | Hamm et al. | 455/68 |
| 2006/0182206 A1 | 8/2006 | Coon et al. | 375/346 |
| 2008/0298515 A1 | 12/2008 | Peyla et al. | 375/343 |
| 2010/0159861 A1* | 6/2010 | Becker | H04L 7/0029 455/205 |

FOREIGN PATENT DOCUMENTS

| | | | |
|---|---|---|---|
| EP | 1679802 A1 | 7/2006 | ............... H04B 1/04 |
| WO | 2012/069471 A1 | 5/2012 | ........... H04B 1/7075 |
| WO | 2012/115453 A2 | 8/2012 | ............ H04N 7/015 |
| WO | 2015/055418 A1 | 4/2015 | ............... H03D 3/00 |

OTHER PUBLICATIONS

Steingass, A. et al., "Frame Synchronization Using Superimposed Sequences," Information Theory, IEEE International Symposium IUM on ULM, p. 489 (1 page), Jun. 29, 1997.

Lamarca, Meritxell et al., "DA-GLRT Burst Detection and Sychronization Based on a Chirp-Like Preamble," 10$^{th}$ International Workshop on Signal Processing for Space Communications (SPSC), 5 pages, Oct. 6, 2008.

Gabelli, Giulio et al., "Code Acquisition Under Strong Dynamics: The Case of TT&C for LEOP," 6$^{th}$ Advanced Satellite Multimedia Systems Conference (ASMS) and 12$^{th}$ Signal Processing for Space Communications Workshop (SPSC), pp. 342-349 (8 pages), Sep. 5, 2012.

German Office Action, Application No. 102013220912.6, 8 pages, dated Mar. 11, 2014.

International Search Report and Written Opinion, Application No. PCT/EP2014/070866, 25 pages, dated Dec. 17, 2014.

Roy, Arban, "Overlay Communications Using Empirical Mode Decomposition," IEEE Systems Journal, vol. 5, No. 1, pp. 121-128, Feb. 18, 2011.

German Office Action, Application No. 102013220912.6, 6 pages, dated Oct. 30 2017.

* cited by examiner

SYSTEM AND METHOD FOR TRANSMITTING DATA WITH USEFUL SIGNAL DETECTION AT THE RECEIVER END

CROSS-REFERENCE TO RELATED APPLICATIONS

This application is a U.S. National Stage Application of International Application No. PCT/EP2014/070866 filed Sep. 30, 2014, which designates the United States of America, and claims priority to DE Application No. 10 2013 220 912.6 filed Oct. 15, 2013, the contents of which are hereby incorporated by reference in their entirety.

TECHNICAL FIELD

The present invention relates to a system and a method for digital data transmission, in particular for the radio transmission of PSK and DSSS signals.

BACKGROUND

A radio receiver generally does not know whether or when a frame is emitted by a transmitter. The decision regarding whether or when a valid useful signal is present is therefore the responsibility of the receiver controller.

In the so-called frame reception mode, although the controller of the receiver can assume that the transmitter will transmit a frame, the receiver does not know the exact time. The receiver must therefore stay in a search mode for a particular time and must wait for the start of the useful signal. In a so-called polling mode, the receiver is activated at regular intervals in order to check whether a useful signal (wanted signal) is received. If a useful signal is detected, the receiver remains active for a period in order to be able to completely receive a frame.

Irrespective of the reception mode used, a receiver is supposed to be able to successfully detect a useful signal and distinguish it from other signals (for example interference signals, noise, etc.). Incorrect detection (failure to recognize a useful signal) may result in the useful signal not being recognized and in the message contained therein not being received and being ignored as a result. Furthermore, incorrect detection of an interference signal as a useful signal ("false alarm") may result in the receiver being activated even though a message is not transmitted. In addition to the sequence of bit values which is to be transmitted and represents the information, a frame contains further parts, for example parts used for signal acquisition. At least the bits are represented by a sequence of modulation symbols which are emitted and need to be detected at the receiver end. Depending on the type of modulation used, each modulation symbol has a particular information content. In the case of unspread PSK modulation, one (binary PSK) or more bits (m-fold PSK) are transmitted for each modulation symbol. In the case of DSSS (direct-sequence spread-spectrum) transmission, a plurality of modulation symbols represent one bit. A message may consist of a plurality of frames.

Many implementations of a digital receiver provide for one or more parameters relevant to the demodulation to be determined before the reception signal is demodulated. For example, a frequency error in the carrier signal (also the phase error in the case of coherent demodulation) and/or the modulation symbol timing (phase angle of the modulation symbols) is/are determined. These parameters are determined with such an accuracy that data can be received (that is to say the reception signal can be demodulated). Parameter control can be optionally used to adjust the current values of the relevant parameters (for example symbol timing) on the basis of the current reception signal, in which case the initially recognized parameter values can be used as starting values.

The parameter detection mentioned which is needed to successfully demodulate the reception signal is part of the acquisition method carried out in the receiver. This method usually comprises a plurality of successive steps which are based on one another, a result obtained in one step not being able to be directly verified or falsified in the next step. In the event of an incorrect change from one acquisition step to the next, a long dwell time may be necessary in this step in order to avoid rejecting—possibly correct—useful signal reception.

SUMMARY

When carrying out the acquisition method, it may therefore be important to know whether the (estimated) results obtained by a particular algorithm have been obtained on the basis of a valid (actually received) useful signal. The teachings of the present disclosure relate to a method and a system for digitally transmitting data, in which reliable detection of the useful signal contained in the reception signal may be improved at the receiver end.

A method for digitally transmitting data, may comprise: receiving a modulated signal ($r(t)$) which contains at least one useful signal or noise or interference signals; repeatedly estimating at least one parameter ($\xi$, $\zeta$; $\theta$) of the received signal ($r(t)$) that is relevant to the demodulation of the useful signal; monitoring changes ($\Delta\xi$, $\Delta\zeta$; $\Delta\theta$) in the repeatedly estimated parameters; and detecting a useful signal using a criterion, according to which a useful signal is recognized if one or more changes ($\Delta\xi$, $\Delta\zeta$; $\Delta\theta$) in the repeatedly estimated parameters satisfy at least one particular, predefined condition.

In some embodiments, the useful signal has a sequence of modulation symbols or spreading codes of a particular period ($T_{SYM}$) and phase angle ($\varphi_{SYM}$; $\xi$) which are modulated onto a carrier signal of a particular carrier frequency ($f_{TX}$).

In some embodiments, at least one frequency error ($f_E$; $\zeta$) of the carrier frequency ($f_{TX}$) at the receiver end or the phase angle ($\varphi_{SYM}$; $\xi$) of the modulation symbols or spreading codes is considered as relevant parameters ($\xi$, $\zeta$; $\theta$).

In some embodiments, the at least one parameter is repeatedly estimated at least occasionally in an asynchronous manner with respect to the period of the modulation symbols or spreading codes.

In some embodiments, the at least one parameter is repeatedly estimated with approximately the same period ($T_{PER}$) as the period of the modulation symbols or spreading codes, a delay time which corresponds to a change in the estimated phase angle ($\varphi_{SYM}$; $\xi$) being awaited at least once in a series of estimations of the at least one parameter ($\xi$, $\zeta$; $\theta$).

In some embodiments, the phase angle ($\varphi_{SYM}$; $\xi$) of the modulation symbols or spreading codes is varied at the transmitter end.

In some embodiments, the useful signal is modulated onto a carrier signal of a particular carrier frequency and the carrier frequency ($f_{TX}$) is changed at the transmitter end. The at least one relevant parameter ($\xi$, $\zeta$; $\theta$) may comprise at least one frequency error ($f_E$; $\zeta$) of the carrier frequency ($f_{TX}$) at the receiver end. The change in the estimated frequency error at the receiver end corresponding to the change in the carrier frequency at the transmitter end.

In some embodiments, the carrier frequency ($f_{TX}$) is changed at the transmitter end by means of frequency modulation using frequency modulation symbols of a particular symbol duration ($T_{FSK}$). The frequency error ($f_E$; ζ) of the carrier frequency ($f_{TX}$) may be regularly estimated at the receiver end at particular estimation times. A useful signal may be recognized during useful signal detection when a predefined number of differences between two estimated values in each case satisfy a predefined criterion. Estimated values whose estimation times are temporally separated by a symbol duration ($T_{FSK}$) or an integer multiple thereof are used to form the differences.

In some embodiments, two successive estimation times are separated by less than a symbol duration ($T_{FSK}$).

In some embodiments, a receiver for receiving a modulated signal (r(t)) which may contain both a useful signal and noise and interference signals, may comprise an acquisition unit. The acquisition unit may carry out repeated estimations of at least one parameter (ξ, ζ; θ) of the received signal (r(t)) that is relevant to the demodulation of the useful signal; monitor changes in the repeatedly estimated parameters; and may detect a useful signal, a criterion being used for the detection, according to which criterion a useful signal is recognized when one or more changes (Δξ, Δζ; Δθ) in the repeatedly estimated parameters satisfy at least one particular, predefined condition.

In some embodiments, a system for digitally transmitting data may comprise: a transmitter emitting, as a useful signal, a sequence of modulation symbols or spreading codes of a particular period ($T_{SYM}$) and phase angle ($\varphi_{SYM}$; ξ) which are modulated onto a carrier signal of a particular carrier frequency ($f_{TX}$); a receiver for receiving a modulated signal (r(t)) which may contain both a useful signal and noise and interference signals; and an acquisition unit which carries out repeated estimations of at least one parameter (ξ, ζ; θ) of the received signal (r(t)) that is relevant to the demodulation of the useful signal, monitors changes in the repeatedly estimated parameters, and detects a useful signal, a criterion being used for the detection, according to which criterion a useful signal is recognized when one or more changes (Δξ, Δζ; Δθ) in the repeatedly estimated parameters satisfy at least one particular, predefined condition.

In some embodiments, at least one frequency error ($f_E$; ζ) of the carrier frequency ($f_{TX}$) at the receiver end or the phase angle ($\varphi_{SYM}$; ξ) of the modulation symbols or spreading codes is considered as relevant parameters (ξ, ζ; θ).

In some embodiments, the transmitter is designed to change the carrier frequency ($f_{TX}$).

In some embodiments, the transmitter is designed to carry out FSK or GFSK with a (G)FSK symbol duration which is considerably longer than the period of the modulation symbols or spreading codes.

In some embodiments, the at least one parameter (ξ, ζ; θ) is repeatedly estimated in the receiver at least occasionally in an asynchronous manner with respect to the period of the modulation symbols or spreading codes.

In some embodiments, the at least one parameter (ξ, ζ; θ) being repeatedly estimated in the receiver with approximately the same period ($T_{PER}$) as the period of the modulation symbols or spreading codes, a delay time which corresponds to a change in the estimated phase angle ($\varphi_{SYM}$; ξ) being awaited at least once in a series of estimations of the at least one parameter.

In some embodiments, the useful signal is modulated onto a carrier signal of a particular carrier frequency ($f_{TX}$) and the carrier frequency ($f_{TX}$) is changed at the transmitter end, and the at least one relevant parameter (ξ, ζ; θ) comprises at least one frequency error ($f_E$; ζ) of the carrier frequency ($f_{TX}$) at the receiver end, the change in the estimated frequency error at the receiver end corresponding to the change in the carrier frequency at the transmitter end.

In some embodiments, the carrier frequency ($f_{TX}$) is changed at the transmitter end by means of frequency modulation using frequency modulation symbols of a particular symbol duration ($T_{FSK}$); the frequency error ($f_E$; ζ) of the carrier frequency ($f_{TX}$) is regularly estimated at the receiver end at particular estimation times; a useful signal is recognized during useful signal detection when a predefined number of differences between two estimated values in each case satisfy a predefined criterion; and estimated values whose estimation times are temporally separated by a symbol duration ($T_{FSK}$) or an integer multiple thereof are used to form the differences.

In some embodiments, two successive estimation times are separated by less than one symbol duration ($T_{FSK}$).

BRIEF DESCRIPTION OF THE DRAWINGS

The invention is explained in more detail below using the examples illustrated in the figures. The illustrated examples should not necessarily be understood as restricting the invention, rather importance is attached to explaining the principles on which the invention is based. In the figures.

DETAILED DESCRIPTION

Figure 1:
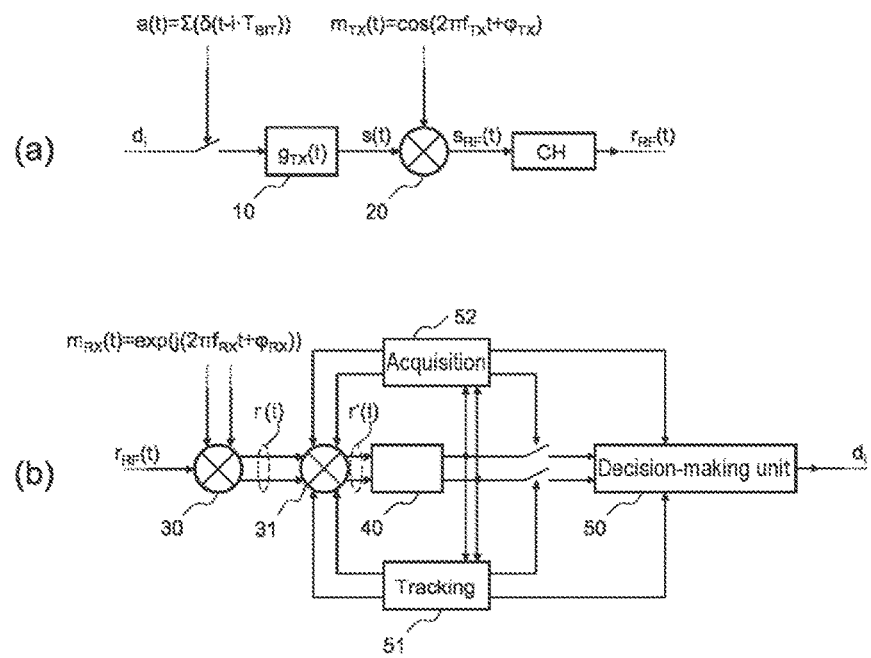
FIG. 1 shows a block diagram of a transmission system for transmitting (a) using binary PSK modulation (phase shift keying) and receiving (b) the modulated signals, according to teachings of the present disclosure.

The teachings of the present disclosure include a method for digitally transmitting data. According to one example, the method comprises the following: receiving a modulated signal which may contain both a useful signal and noise and interference signals; repeatedly estimating at least one parameter of the received signal that is relevant to the demodulation of the useful signal; and monitoring changes in the repeatedly estimated parameters. A useful signal is detected using a criterion, according to which a useful signal is recognized when one or more changes in the repeatedly estimated parameters satisfy at least one particular, predefinable condition. Such detection of a useful signal makes it possible to reduce the false alarm rate, that is to say the incorrect recognition of a useful signal.

The useful signal may have a sequence of modulation symbols or spreading codes, the modulation symbols or spreading codes, which can be assigned a period and a phase angle, being modulated onto a carrier signal of a particular carrier frequency. At least one frequency error of the carrier frequency at the receiver end or the phase angle of the modulation symbols or spreading codes comes into consideration as relevant parameters. Both parameters are estimated in the receiver and are needed to demodulate the useful signal.

In order to change the phase angle of the modulation symbols or spreading codes received with the useful signal, the at least one parameter can be repeatedly estimated at least occasionally in an asynchronous manner with respect to the period of the modulation symbols or spreading codes. According to one exemplary embodiment, the at least one parameter is repeatedly estimated with approximately the same period as the period of the modulation symbols or spreading codes. In this case, a delay time which then corresponds to a change in the estimated phase angle is awaited at least once in a series of estimations of the at least one parameter.

As mentioned, the frequency error of the carrier frequency at the receiver end comes into consideration as a relevant parameter to be estimated. The useful signal is modulated onto a carrier signal of a particular carrier frequency in the transmitter and this carrier frequency can be changed at the transmitter end, with the result that the change in the estimated frequency error at the receiver end corresponds to the change in the carrier frequency at the transmitter end.

The carrier frequency can be changed at the transmitter end by means of frequency modulation using frequency modulation symbols of a particular symbol duration. The frequency error of the carrier frequency is regularly estimated at the receiver end at particular estimation times. A useful signal is recognized during useful signal detection when a predefinable number of differences (changes) between two estimated values in each case satisfy a predefinable criterion. In this case, estimated values whose estimation times are temporally separated by a symbol duration or an integer multiple thereof are used to form the differences. However, two (immediately) successive estimation times are temporally separated by less than a symbol duration. As a result, estimated values which are based on frequency values in the transition ranges (caused by frequency modulation) from one frequency value to another do not result in the recognition of a useful signal. However, at the next estimation time, the carrier frequency error can then be correctly estimated in the receiver and the estimated results can be used for signal acquisition and demodulation.

In the figures, identical reference symbols denote identical or similar components or signals with an identical or similar significance.

FIG. 1 uses a block diagram to show the model of digital data transmission for the case of BPSK modulation (binary phase shift keying) which was selected, by way of example, for a linear modulation method (for example QAM, PSK). A pulse $g_{TX}(t)$, which is referred to as a symbol or modulation symbol, is emitted for each data symbol (one bit in the present case) $d_i$. In the model shown in FIG. 1, the sequence of bits $d_i$, which can each assume the values of +1 and −1, is periodically sampled with a period duration $T_{BIT}$ and a Dirac pulse $\delta$ $(t-i \cdot T_{BIT})$ corresponding to the polarity of the bit $d_i$ is supplied to the filter 10 which then outputs its pulse response $g_{TX}(t)$ with a polarity corresponding to the polarity of the symbol $d_i$. That is to say, at each sampling time $i \cdot T_{BIT}$ (k is an integer time index), the filter 10 outputs the pulse response $g_{TX}(t-i \cdot T_{BIT})$ or $-g_{TX}(t-i \cdot T_{BIT})$ depending on the sample (+1 or −1), which pulse response is also referred to as a modulation symbol. The sum of the temporally offset pulse responses (modulation symbols) produces the signal s(t) to be transmitted. This signal s(t) is converted into the radio-frequency range (RF range) with the aid of the mixer 20, the output signal from the mixer being referred to as the transmission signal $s_{RF}(t)$. This transmission signal $s_{RF}(t)$ passes to the receiver via the transmission channel (for example a radio path).

The oscillator signal $m_{TX}(t)$ (also called carrier signal) which is supplied to the mixer 20 has a frequency $f_{TX}$ and a phase $\varphi_{TX}$ (carrier frequency and carrier phase). This means that the spectrum of the RF transmission signal $s_{RF}(t)$ is spectrally shifted by the absolute value of the carrier frequency $f_{TX}$ in comparison with the spectrum of the transmission signal s(t) in the baseband (the signal spectrum is then symmetrical around the carrier frequency $f_{TX}$). The block diagram of the described transmitter is illustrated in FIG. 1a and the corresponding block diagram of the receiver is illustrated in FIG. 1b.

The (radio-frequency) transmission signal $s_{RF}(t)$ transmitted via the channel CH is distorted by the transmission channel CH and has interference and noise superimposed on it on the way to the receiver. The reception signal corresponding to the transmission signal $s_{RF}(t)$ is denoted $r_{RF}(t)$. The reception signal $r_{RF}(t)$ is therefore a superimposition of the transmission signal $s_{RF}(t)$ distorted by the channel with interference signals j(t) and noise n(t).

At the receiver end, the reception signal $r_{RF}(t)$ is converted to the baseband with the aid of a complex multiplication 30 (with the aid of the nominal oscillator frequency at the receiver end, that is to say the carrier frequency $f_{Rx}$). The result of the complex multiplication 30 comprises an in-phase signal $r_I(t)$ and a corresponding quadrature signal $r_Q(t)$, both together being referred to as a complex signal $r(t)=r_I(t)+j \cdot r_Q(t)$ (j is the imaginary unit).

The mixer 30 represents, by way of example, frequency conversion (implemented in any desired manner) of the reception signal $r_{RF}(t)$ to the baseband. This frequency conversion can be carried out in one step (referred to as direct down-conversion) or in a plurality of steps (with a plurality of successive (complex) multiplications). The spectral component of the useful signal which occurs during frequency conversion and has a frequency which is the opposite in terms of absolute value and is twice the mixing frequency can be suppressed by the reception filter 40 which usually has low-pass properties.

In any case, the spectral situation of the useful signal at the output of the frequency conversion (that is to say the signal r(t)) has only one frequency error $f_E$. This frequency error $f_E$ corresponds, for example, to the difference in the (carrier) frequency used at the transmitter end and at the receiver end for up-conversion and down-conversion, that is to say $f_E=f_{TX}-f_{RX}$. This arises as a result of the fact that, in practice, the nominal transmission frequency (carrier frequency) can be provided both at the transmitter end and at the receiver end only with finite accuracy, that is to say the frequency normals used (for example crystals), from which the frequencies for up-conversion and down-conversion are derived, have errors.

In addition to the frequency error $f_E$, the spectral situation of the useful signal at the output of the frequency conversion (that is to say the signal r(t)) may also have further frequency error components which may be produced, for example, by the Doppler effect during radio transmission via the channel CH. A phase error $\varphi_E = \varphi_{TX} - \varphi_{RX}$ must also be heeded during coherent demodulation. The mixer 30 therefore very generally represents the (single-stage or multistage) conversion of the received RF signal $r_{RF}(t)$ to the baseband.

This (previously estimated) frequency error $f_E$ is corrected using a second complex multiplication (mixer 31). Only the frequency error on account of the frequency estimation which was possible only with limited accuracy then remains. The mixer 31 therefore very generally (irrespective of the specific implementation) represents the correction of the above-mentioned frequency error. If coherent demodulation is used, the phase error $\varphi_E$ can also be corrected with the aid of the mixer 31, for example.

In addition to the distortion and interference mentioned, the output signal r'(t) (which is complex and, with regard to the estimation accuracy, no longer has a frequency error) from the second mixer 31 (that is to say the corrected reception signal in the baseband) contains the modulation symbol sequence, that is to say the temporally offset pulse responses $g_{TX}(t-i \cdot T_{BIT})$ and $-g_{TX}(t-i \cdot T_{BIT})$ corresponding to the transmission signal s(t). The signal r'(t) is supplied to a reception filter 40 whose pulse response $g_{RX}(t)$ can be matched to the transmitted pulses $g_{TX}(t)$. This is referred to as "matched filter reception". Data reception with the aid of matched filters is known per se and is therefore not explained in any more detail. However, in a manner deviating from the known theoretical relationships, simplifications can be made, in particular at the receiver end, in terms of the implementation (for example a raised cosine filter pulse response in the transmitter but a rectangular filter pulse response in the receiver).

The receiver from FIG. 1b also comprises an acquisition unit 52 which is designed to determine parameters which are relevant to the correct demodulation, in particular to estimate the frequency error $f_E$ mentioned (also the phase error $\varphi_E$ in the case of coherent demodulation). The acquisition unit 52 is also designed to estimate the phase angle $\varphi_{SYM}$ of the modulation symbols (that is to say the modulation symbol timing), that is to say of the emitted pulse responses $g_{TX}(t)$.

The tracking unit 51 is designed to adjust the estimated frequency and phase errors $f_E$, $\varphi_E$ in the event of a temporal change in the carrier frequencies $f_{RX}$, $f_{TX}$ and the corresponding phases $\varphi_{RX}$, $\varphi_{TX}$ and in the event of a temporal change in the phase angle of the modulation symbols. Such a control loop is also referred to as a "carrier tracking loop". The tracking unit 51 is also designed to adjust the estimated phase angle of the received modulation symbols. Such a control loop is also referred to as a "symbol tracking loop" or "clock tracking loop". The control loops (and therefore the tracking unit) need not necessarily be present, for example if the values estimated by the acquisition unit are sufficiently accurate for transmitting a frame.

The acquisition unit is used to (roughly) determine the carrier frequency and the phases of the carriers and the modulation symbol timing, but is not used for control. A closed control loop is usually used only in tracking; strictly speaking, there are two control loops, namely the "carrier tracking loop" mentioned and the "symbol tracking loop". This adjustment of the estimated phase and frequency error and of the phase angle of the modulation symbols is known per se and is therefore not explained in any more detail. The actual implementation also does not play a significant role for the present invention.

The blocks illustrated in the figures (mixer, filter, acquisition unit, tracking unit, etc.) should not be understood as a structural unit but rather purely as functional units. Depending on the application, they can be implemented in very different ways. The mixers 5, 10, 30 and 31 represent a mathematical operation (possibly a complex multiplication). The acquisition unit and the tracking unit therefore generate signals of the form $\exp(j(2\pi \cdot \Delta f \cdot t + \Delta \varphi))$ for the respective mixer 31 which uses them to implement a frequency conversion by a difference frequency $\Delta f$ and a phase rotation by $\Delta \varphi$. This complex multiplication also represents, by way of example, a wide variety of possible implementations (for example with one or two multipliers/mixers in any order).

The acquisition unit 52 is also used to ascertain the correct (sampling) times (bit and symbol limits) at which a decision (decision-making unit 50) relating to the value of a transmitted data symbol is intended to be made. During tracking, these times are tracked by the tracking unit 51. The mentioned frequency error $f_E$ (or else the carrier phase $\varphi_{RX}$ in the case of coherent demodulation) in the reception signal is estimated by the acquisition unit 52 with such accuracy that the control loops in the tracking unit (PLL or FLL) can be started. As shown in FIG. 1b, the frequency error is usually corrected before filtering by the matched filter 40.

Figure 2:
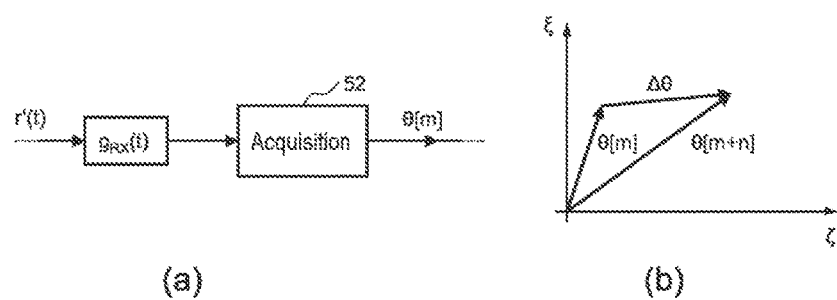
FIG. 2 illustrates the method of operation of an acquisition unit as is used, for example, in a receiver according to FIG. 1b.

The parameters estimated by the acquisition unit 52 can generally be considered to be a vector $\theta[m]$, where m denotes a discrete time. The acquisition unit 52 processes the baseband reception signal r'(t) or the filtered reception signal (pulse response $g_{RX}(t)$) and uses it to estimate a parameter vector $\theta[m]$ at discrete times. This relationship is illustrated in FIG. 2a. In the present example, the vector $\theta[m]$ comprises the components $\xi[m]$ and $\zeta[m]$, where $\zeta[m]$ may represent a frequency error $f_E$ and $\xi[m]$ may represent a modulation symbol phase angle $\varphi_{SYM}$ at the time m, for example. The estimated parameter vector $\theta[m+n]$ may differ from the previously estimated vector $\theta[m]$ at a later time m+n (n intervals later). This situation is illustrated in the graph in FIG. 2b. The difference vector $\theta[m+n] - \theta[m]$ is denoted $\Delta \theta G[m+n]$.

Estimation algorithms (acquisition algorithms) which can be used to estimate said parameters and a parameter vector $\theta[m]$ are known per se and are not explained in any more detail here. The publication WO 2012/069471 A1 describes, for example, an acquisition algorithm which is suitable for spread spectrum signals (in the case of DSSS transmission methods, DSSS="direct-sequence spread-spectrum"). In this case, a code phase of the spreading code is estimated instead of the modulation symbol phase. The receiver shown in FIG. 1b can be used to receive both PSK signals and DSSS signals. In the case of PSK, the reception filter (see filter 40) is a matched filter which can be tuned to the pulse response $g_{TX}(t)$ selected at the transmitter end. In the case of DSSS transmission, the reception filter can be designed in such a manner that it substantially correlates the reception signal with the spreading code. All of the methods and systems described here for detecting useful signals can be used both for PSK receivers and for DSSS receivers and transmission systems.

In some embodiments, a first parameter vector $\theta[m]$ is estimated at a first time m and a second parameter vector $\theta[m+n]$ is estimated at a second, later time m+n. The estimation is carried out on the basis of the reception signal r(t) and always provides a result irrespective of whether or not the reception signal actually contains a useful signal. A difference vector $\Delta \theta \, \theta[m+n] - \theta[m]$ is then calculated. If the difference vector satisfies a particular relationship, for example $\|\Delta\theta\|>\epsilon$ (where $\epsilon$ is a predefined small positive numerical value), a valid useful signal is detected in the reception signal. In this respect, the transmission signal is manipulated at the transmitter end in such a manner that a particular change in the estimated parameter vectors can be detected (and possibly quantified) at the receiver end. This makes it possible to reliably prevent a useful signal being incorrectly recognized in the reception signal in the receiver even though no useful signal is present. The so-called false alarm rate (FAR) can therefore be reduced.

When receiving linearly modulated data symbols, for example when using phase shift keying (PSK) or quadrature amplitude modulation (QAM), the two components $\xi$ and $\zeta$ of the parameter vector $\theta$ to be estimated are, in particular, the mentioned carrier frequency error $f_E$ and the modulation symbol timing (symbol phase angle $\varphi_{SYM}$).

In this case, the two-dimensional estimated vectors can be represented in a field according to FIG. 2b. Further possibly relevant parameters are the carrier phase error $\varphi_E$ and the reception field strength. When receiving spread spectrum signals (referred to as DSSS signals below), the initial code phase of the spreading code, that is to say the starting time of a run through the spreading sequence, is estimated instead of the modulation symbol phase, as mentioned.

Figure 3:
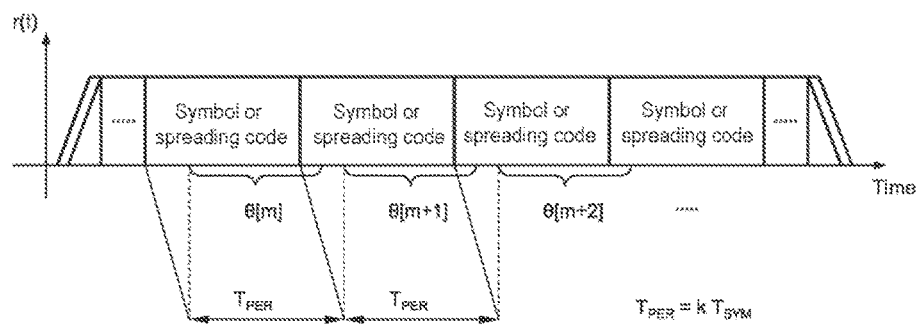
FIG. 3 illustrates parameter estimation which is in sync with the modulation symbol phase.

As already mentioned, an estimation algorithm always provides a result irrespective of whether or not the reception signal contains a useful signal. For reliable useful signal detection, the estimated results must be verified. This can be achieved, inter alia, by restarting the estimation algorithm periodically (period duration $T_{PER}$), in particular with an integer multiple k of the a-priori approximately known modulation symbol period duration $T_{SYM}$, that is to say $T_{PER}=k\cdot T_{SYM}$, where (k∈N). This situation is illustrated in FIG. 3. If the estimated parameter vector is always (approximately) the same, a useful signal is detected. This presupposes the assumption that, in the absence of a useful signal, the estimated results are random and, in particular, uncorrelated and no (approximately) identical estimated results are therefore achieved. However, this assumption often does not apply in practice. For example, on account of quantization and saturation effects, some positions (result vectors $\theta$) may be more likely than others in the field illustrated in FIG. 2b. The same applies when narrowband interference signals (jammer signals), for example, are present, which may result in a useful signal being detected even though no useful signal is present (false alarm). The more pronounced the occurrence of preferred estimated vectors is, the higher the false alarm rate (FAR) is.

Figure 4:
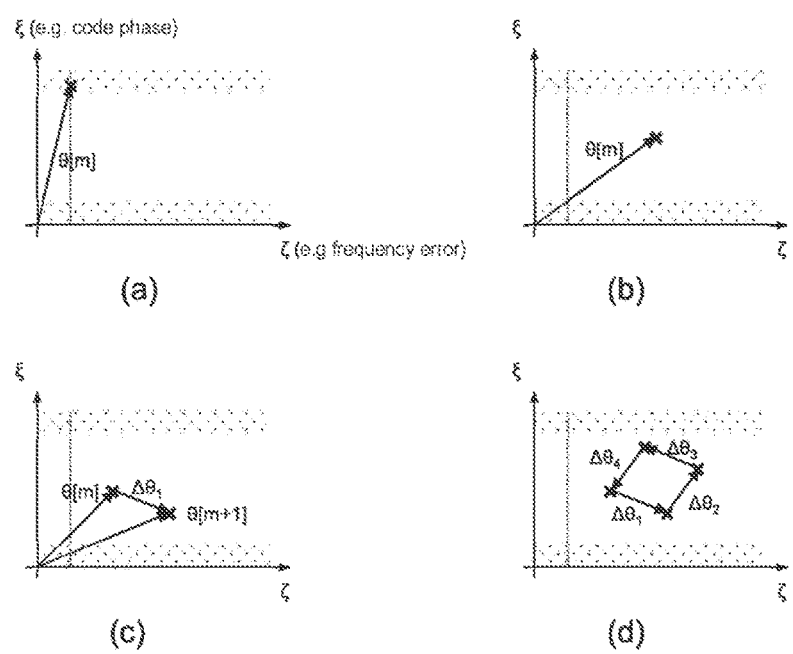
FIG. 4 shows the visualization of the estimated parameter vectors in a two-dimensional result field.

FIG. 4 illustrates different variants of the parameter estimation by the acquisition unit 52. The graphs in FIGS. 4a to 4d each show a two-dimensional field of estimated results, in which an estimated parameter vector $\theta$ can be marked. In the examples illustrated, the parameter $\zeta$ corresponds to the carrier frequency error $f_E$ and the parameter $\xi$ corresponds to the modulation symbol phase $\varphi_{SYM}$ or the code phase (in the case of DSSS signals). A point marked with an "x" in the result field is defined by the coordinates ($\zeta$, $\xi$) and corresponds to a particular combination of carrier frequency error and modulation symbol phase. The dotted vertical line in the graphs marks a frequency error $\zeta$ which corresponds to a particular narrowband interferer (jammer). It has been shown that, even in the absence of a useful signal in the reception signal, the estimation algorithms preferably determine a point on the vertical, dotted line and therefore incorrectly indicate a useful signal. When using some estimation algorithms (for example the algorithm described in the publication WO 2012/069471 A1), the dotted stored edge regions of the result field are also preferred. That is to say, in the absence of a useful signal, an estimated result is more frequently in these edge regions than outside said regions, which may likewise result in an increased FAR.

In the example shown in FIG. 4a, the reception signal does not contain a useful signal and the acquisition unit 52—on account of a narrowband interferer—nevertheless recognizes a useful signal at the location marked "x" on the dotted line which is determined by the frequency of the interferer. In the example shown in FIG. 4b, a useful signal is present and the same parameter combination $\theta[m]$ marked with "x" is repeatedly recognized (m=1, 2, 3, . . . ). The acquisition unit 52 therefore detects a useful signal. In the two examples from FIGS. 4a and 4b, a useful signal is detected if the parameter estimation repeatedly provides the same result. For the reasons discussed, identical results may also occur when there is no useful signal.

Figure 5:
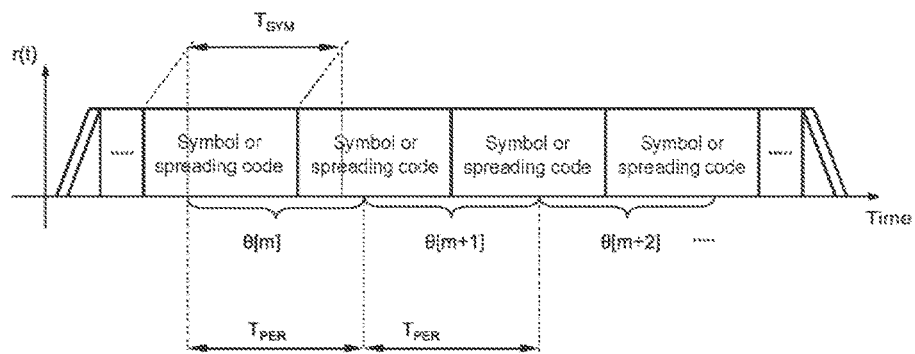
FIG. 5 illustrates parameter estimation which is asynchronous with respect to the modulation symbol phase.

Instead of searching for an estimated result $\theta[m]$ which remains the same (within a certain tolerance range), it is possible to search for particular changes $\Delta\theta_1$, $\Delta\theta_2$, etc. in the parameter vector in order to reduce the false alarm rate (FAR), as illustrated in FIGS. 4c and 4d. In order to cause these changes $\Delta\theta_1$, $\Delta\theta_2$, etc., either the parameter vector $\theta$ to be estimated in the receiver can be manipulated according to a predefinable pattern (for example the carrier frequency or the modulation symbol phase) at the transmitter end or the estimation algorithm is started asynchronously with respect to the modulation symbol period $T_{SYM}$, unlike in the example shown in FIG. 3, in a transmission system. In this case, the factor $k=T_{PER}/T_{SYM}$ would not be an integer. This situation is illustrated in FIG. 5.

Carrying out the estimation algorithm asynchronously (with respect to the modulation symbol period $T_{SYM}$) produces defined "jumps" $\Delta\theta_1$, $\Delta\theta_2$, etc. in the estimated results $\theta[1]$, $\theta[2]$, etc. if a useful signal is present. With a relationship of $k=T_{PER}/T_{SYM}=1.25$, the parameter estimation is carried out four times within five symbol periods (or spreading code periods). If a useful signal is present, approximately the same result is therefore estimated only in every fourth estimation, that is to say $\theta[m]=\theta[m+4]$ for m=1, 5, 9, etc. Asynchronously carrying out the estimation algorithm changes only the modulation symbol phase $\xi$. In order to change the frequency error $\zeta$ to be estimated, the carrier frequency can additionally be changed at the transmitter end in the transmission system. A carrier frequency change only at the receiver end would concomitantly shift the interference signal components and would therefore be ineffective. FIG. 4d illustrates a situation in which every fourth estimated value is approximately the same in each case. Four vectors of parameter differences $\Delta\theta_1$, $\Delta\theta_2$, $\Delta\theta_3$, $\Delta\theta_4$, ($\Delta\theta_5=\Delta\theta_1$) therefore alternately occur.

Figure 6:
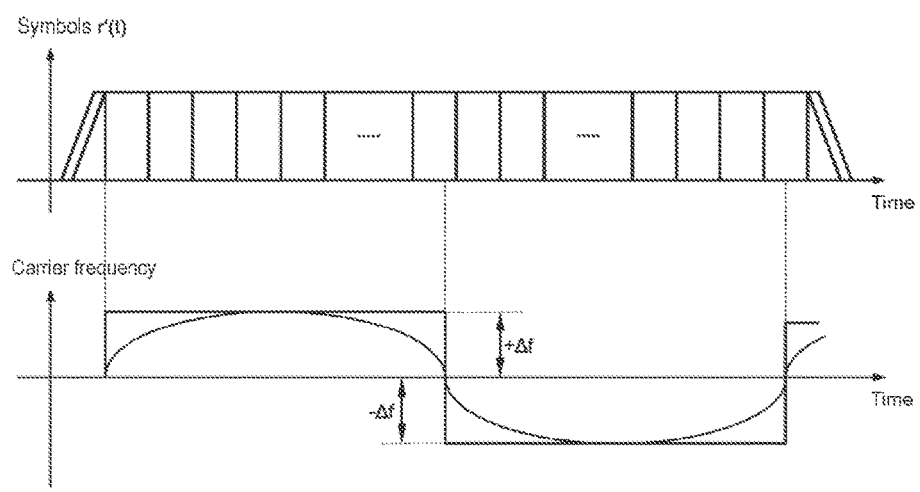
FIG. 6 illustrates modulation of the carrier frequency at the transmitter end in order to change the parameters estimated in the receiver.

The mentioned carrier frequency change at the transmitter end may be achieved, for example, by means of frequency modulation, for example FSK (frequency shift keying) and, in particular, GFSK (Gaussian frequency shift keying). One example of this is outlined in FIG. 6. The estimation algorithm which provides the estimated values for the parameter vectors $\theta[m]$ operates comparatively slowly in comparison with the modulation symbol rate. That is to say, an estimated result is calculated on the basis of one or more modulation symbols (repeated runs through the spreading code during DSSS signal transmission), which is why the change in the frequency is selected to be slow in comparison with the symbol rate. FIG. 6 illustrates a periodic, sudden frequency change by the value $\Delta f$ and GFSK.

Figure 7:
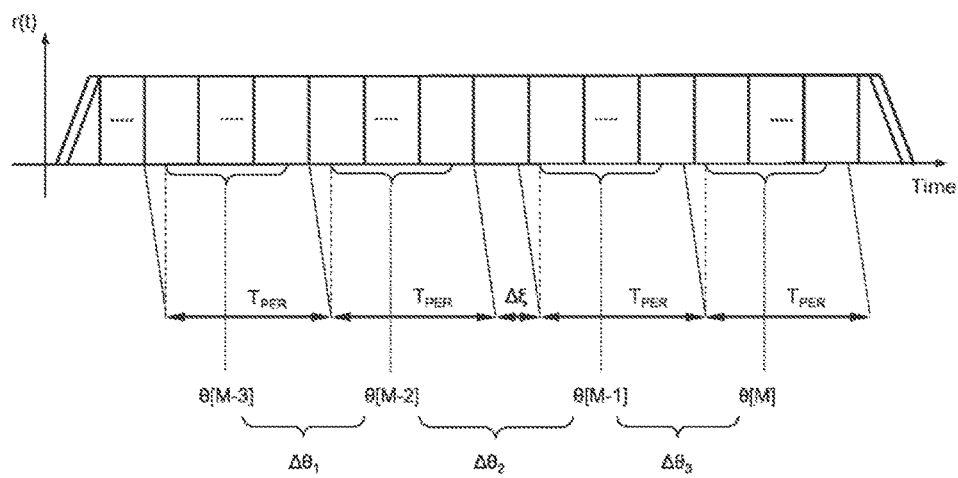
FIG. 7 illustrates an example of useful signal detection, according to teachings of the present disclosure.
Figure 8:
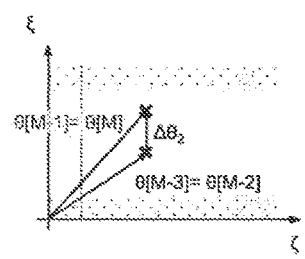
FIG. 8 illustrates the parameter vectors obtained according to the example from FIG. 7 in a two-dimensional result field.

One example of useful signal detection is now explained using FIGS. 7 and 8. Parameter estimation is first of all carried out in sync with the modulation symbols (or with the repeating runs through the spreading code during DSSS transmission), as illustrated in FIG. 3. The result of each estimation is a parameter vector $\theta$. As soon as two (approximately) identical estimated results are present (in FIG. 7, $\theta[M-2]=\theta[M-3]$ and consequently $\|\Delta\theta_1\|=0$, for example), a delay time (corresponds to a phase offset $\Delta\xi$) is awaited before the subsequent parameter estimation. If a useful signal is present, the next estimated value $\theta[M-1]$ differs from the previous value $\theta[M-2]$ by the inserted delay time or the corresponding phase offset, that is to say $\|\Delta\theta_2\|=\Delta\xi$. The parameter estimation then continues in a synchronous manner. If the same parameter value $\theta[M]=\theta[M-1]$, that is to say $\|\Delta\theta_3\|=0$, is determined again in the next estimation, a useful signal is recognized. FIG. 8 illustrates this example in the two-dimensional result field (in a similar manner to FIG. 4).

Figure 9:
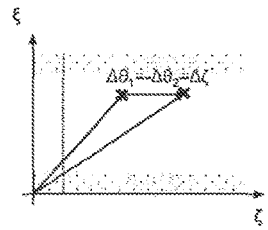
FIG. 9 illustrates the estimated parameter vectors during frequency shift keying at the transmitter end.

In some situations, information relating to the symbol timing (symbol phases) is not (yet) available at the receiver end and a frequency change impressed at the transmitter end must be detected. In these cases, the decision regarding whether a useful signal is received must be made on the basis of this frequency change. The detected points are then on a horizontal line in the two-dimensional result field, as illustrated in FIG. 9.

Figure 10:
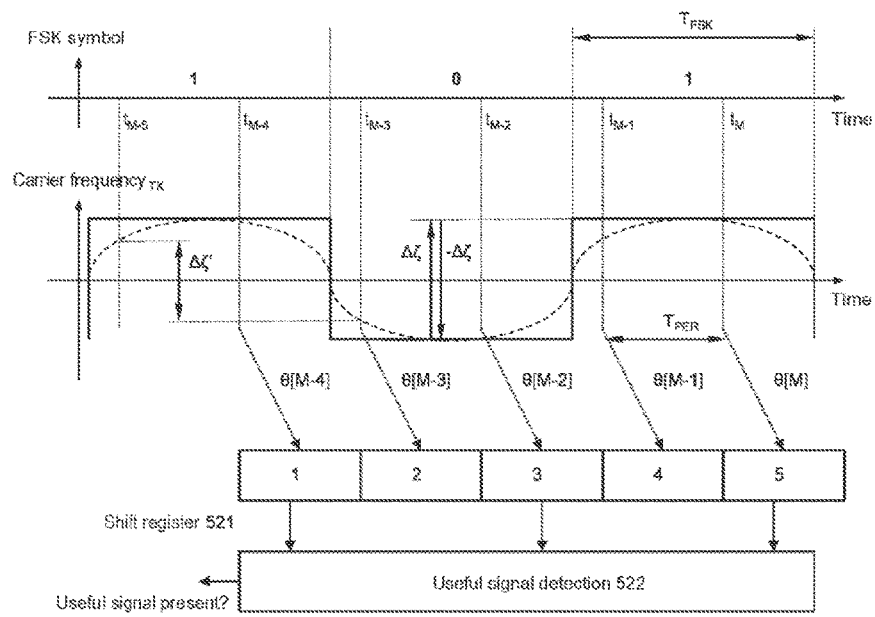
FIG. 10 illustrates a further example of useful signal detection with frequency shift keying at the transmitter end, according to teachings of the present disclosure.

For example, in the example illustrated in FIG. 10, the frequency (and therefore the carrier frequency error at the receiver end) changes by the absolute value $\pm\Delta\zeta$. In this case, the solid line represents the frequency profile during frequency shift keying (FSK) and the dashed line represents the frequency profile during Gaussian frequency shift keying (GFSK). This frequency change impressed at the transmitter end is produced on the basis of changing FSK symbols which are modulated onto the carrier frequency at the transmitter end. In the present example (see FIG. 10), the bit string "101" is transmitted, where a "1" is coded by a carrier signal section of the frequency $f_{TX}+\Delta\zeta/2$ and a "0" is coded by a carrier signal section of the frequency $f_{TX}-\Delta\zeta/2$. Each FSK symbol (that is to say the carrier signal section mentioned) has a duration which is denoted $T_{FSK}$ and is generally substantially longer (for example by a factor of 5 or more) than the duration of a modulation symbol (in PSK modulation) or a run through a spreading code (during DSSS transmission).

In the case of pure frequency shift keying (solid line in FIG. 10), the carrier frequency (at the transmitter end) is $f_{TX}\pm\Delta\zeta/2$, as explained. According to FIG. 9, a useful signal is detected if the frequency errors estimated at the receiver end have a sufficiently large change, namely ideally precisely by the absolute value $\Delta\zeta$. In one practical implementation, the estimated frequency error is compared with a threshold value which is slightly smaller in terms of absolute value than the ideal frequency swing $\Delta\zeta$. The ideal situation is not present, in particular, when estimated values which have been determined in the transition ranges from the carrier frequency $f_{TX}-\Delta\zeta/2$ to the carrier frequency $f_{TX}+\Delta\zeta/2$ (and vice versa) are used for the decision regarding whether or not a useful signal is present. This is problematic, in particular, when using filtered FSK (for example GFSK) in which said transition ranges are relatively wide, that is to say the time for a transition is relatively long. In the example from FIG. 10, in the case of GFSK, the estimated change in the carrier frequency between the times $t_{M-5}$ and $t_{M-3}$ is only $\Delta\zeta'$, which is smaller than the frequency change $\Delta\zeta$ which occurs between the times $t_{M-2}$ and $t_M$, for example.

For reliable estimation, the period $T_{PER}$ for which estimated results are evaluated and the FSK symbol duration of the (FSK) frequency modulation $T_{FSK}$ are (approximately) matched to one another. In the example illustrated in FIG. 2, $T_{PER}=T_{FSK}/2$. A nominal value of the (G)FSK symbol duration $T_{FSK}$ is known at the receiver end. If an estimated value (for example $\theta[M-5]$) is calculated for a time (estimation time) which falls in a transition range, the subsequent estimated value (for example $\theta[M-4]$ half an FSK symbol duration $T_{FSK}/2$ later) is in any case no longer based on frequency values from the transition range (and the estimated values $\theta[M-2]$ and $\theta[M]$ are not either). In this context, it is pointed out that, for the parameter estimation, the reception signal is considered for a certain period which is not infinitesimally small. Nevertheless, it is possible to refer to an estimation time which is that time at which the estimated result is available (for example in the shift register 521 (see FIG. 10)).

For example, in the example illustrated in FIG. 10, the FSK symbol duration $T_{FSK}$ of the frequency shift keying at the transmitter end is twice as long as the period $T_{PER}$ of the parameter estimation which is periodically carried out. However, only every second estimated value is used to calculate the parameter difference $\Delta\theta_2$. In the present example, a shift register R (numeral 521 in FIG. 10) contains the results of the last five frequency estimations at a time M, that is to say $R(1, 2, 3, 4, 5)=[\zeta(M-4), \zeta(M-3), \zeta(M-2), \zeta(M-1), \zeta(M)]$. A useful signal is recognized if the differences at positions 1, 3 and 5 satisfy the following conditions: $R(5)-R(3)>+\Delta\zeta_{SW}$ and $R(3)-R(1)<-\Delta\zeta_{SW}$, where $\Delta\zeta_{SW}$ is a threshold value which may be slightly lower than the frequency swing $\Delta\zeta$ impressed at the transmitter end. If these differences are too small (because $\Delta\zeta'<\Delta\zeta_{SW}\leq\Delta\zeta$) at the time M to detect a useful signal, as illustrated in FIG. 10, the useful signal will be detected at the time M+1 (that is to say a time $T_{PER}=T_{FSK}/2$ later).

Estimations which are based on frequencies in the transition ranges do not result in useful signal recognition because the difference $\Delta\zeta'<\Delta\zeta_{SW}$ is too small, that is to say in terms of absolute value. These estimations are therefore discarded or ignored. If a useful signal is detected, the frequency estimations have not been obtained on the basis of input signals with frequencies in the transition ranges. Basically, this means that the subsequent reception steps (for example further signal acquisition steps and/or demodulation) can use these estimated frequency results with sufficient accuracy to correct the frequency error. The threshold value $\Delta\zeta_{SW}$ can be selected such that estimated results based on frequencies in said transition ranges do not result in useful signal recognition during useful signal detection.

Quite generally, it must only be ensured that useful signal detection is carried out only with suitable synchronization of the estimation times $t_{M-5}, t_{M-4}, t_{M-3}, t_{M-2}, t_{M-1}, t_M$ (that is to say the times at which an estimated vector $\theta$ is determined) with the FSK symbol duration $T_{FSK}$ and is not carried out in said transition ranges. In the example shown in FIG. 10, this is achieved by virtue of only every second estimated value ever being considered for a useful signal decision (that is to say for calculating the difference between the estimated frequency errors) when calculating the parameter change $\Delta\zeta$ (cf. FIG. 9). If the calculated differences for the time M do not result in a useful signal being detected because the estimations all fall within the transition ranges and provide excessively small values, this will be the case for the time M+1. At the time M+1, the calculated differences are then no longer in the transition ranges. This is because the estimation times $t_{M-5}, t_{M-4}, t_{M-3}, t_{M-2}, t_{M-1}, t_M$ are each separated by half an FSK symbol duration and, in contrast, the estimation times for estimated values which are each used to calculate a difference are separated by a complete FSK symbol duration $T_{FSK}$.

Two estimated values whose estimation times are (approximately) separated by a complete FSK symbol duration are always used to calculate the difference $\Delta\zeta$ (or $\Delta\theta$). However, the estimation times are separated by less than an FSK symbol duration, by half a symbol duration $T_{FSK}/2$ in each case in the present example. In the example in FIG. 10, this is achieved in a simple manner by respectively using the even and odd estimated values to form the differences $\Delta\zeta$ (or $\Delta\theta$); the associated estimation times are always separated by $2T_{PER}=T_{FSK}$. In contrast, the interval of time between two directly successive estimated values is considerably shorter (for example $T_{PER}=T_{FSK}/2$).

Choosing $T_{PER} \leq T_{FSK}/2$ also means that a test of useful signal detection exists in any case, which test was obtained on the basis of parameter estimations which are completely within a symbol duration of the respective (G)FSK symbol (if not at the time M, then at the time M+1). If $T_{PER} > T_{FSK}/2$ were selected, there would be transmitting/receiving constellations which carry out useful signal detection only on the basis of estimated results in said transition ranges. This would result in losses in sensitivity, for example.

It is possible to combine the examples from FIGS. 5 to 10.

The above-described methods and system are particularly suitable for use in motor vehicles, in particular for keyless (remote-controlled) access and starting systems of motor vehicles.

LIST OF REFERENCE SYMBOLS $d_i$ Bit string
$m_{TX}(t)$ Oscillator signal (at the transmitter end)
$f_{TX}$ Carrier frequency
$g_{TX}( )$ Pulse response (at the transmitter end)
$s(t)$ Transmission signal (baseband)
$s_{RF}(t)$ Transmission signal (RF band)
CH Transmission channel
$r_{RF}(t)$ Reception signal (RF band)
$r(t)$ Reception signal (baseband)
$r'(t)$ Corrected reception signal (baseband)
10 Filter at the transmitter end (pulse response $g_{TX}(t)$)
20 Mixer at the transmitter end (baseband to RF band)
30 Mixer at the receiver end (RF band to baseband)
30 Further mixer (at the receiver end)
40 Matched filter
50 Decision-making unit
51 Tracking unit
41 Acquisition unit
$m_{RX}(t)$ Oscillator signal (at the receiver end)
$f_{RX}$ Carrier frequency (at the receiver end)
$f_E$ Carrier frequency error (at the receiver end)
$\varphi_{SYM}$ Modulation symbol phase
$T_{PER}$ Period of the estimations
$T_{FSK}$ Period of the FSK symbols
$\theta$ Vector of parameters to be estimated
$\xi$ Estimated modulation symbol phase
$\zeta$ Estimated carrier frequency error (at the receiver end)
$\Delta\theta, \Delta\xi, \Delta\zeta$ Changes in $\theta, \xi$ and $\zeta$
$\zeta_{SW}$ Threshold value

What is claimed is:

1. A method for digitally transmitting data, the method comprising:
receiving a modulated signal containing at least one useful signal or noise or interference signals, wherein the useful signal has a sequence of modulation symbols or spreading codes of a particular period and phase angle modulated onto a carrier signal of a particular carrier frequency;
repeatedly estimating at least one parameter of the received signal relevant to demodulation of the useful signal with approximately the same period as the period of the modulation symbols or spreading codes;
monitoring changes in the repeatedly estimated parameters;
awaiting a delay time which corresponds to a change in an estimated phase angle at least once in a series of estimations of the at least one parameter; and
identifying the useful signal within the modulated signal based at least in part on whether one or more changes in the repeatedly estimated parameters satisfy at least one particular, predefined condition;
wherein the at least one parameter is repeatedly estimated at least occasionally in an asynchronous manner with respect to the period of the modulation symbols or spreading codes.

2. The method as claimed in claim 1, wherein at least one frequency error of the carrier frequency once received or the phase angle of the modulation symbols or spreading codes is considered as a relevant parameter.

3. The method as claimed in claim 1, wherein the phase angle of the modulation symbols or spreading codes is varied during transmission of the useful signal.

4. A method for digitally transmitting data, the method comprising:
receiving a modulated signal containing at least one useful signal or noise or interference signals;
repeatedly estimating at least one parameter of the received signal relevant to demodulation of the useful signal;
monitoring changes in the repeatedly estimated parameters;
modulating the useful signal onto a carrier signal of a particular carrier frequency;
changing the carrier frequency during transmission, wherein the at least one relevant parameter comprises at least one frequency error of the carrier frequency in the received modulated signal, and the change in an estimated frequency error once received corresponds to the change in the carrier frequency during transmission; and
identifying the useful signal within the modulated signal based at least in part on whether one or more changes in the repeatedly estimated parameters satisfy at least one particular, predefined condition.

5. The method as claimed in claim 4, further comprising:
Changing the carrier frequency at a transmitter end by means of frequency modulation using frequency modulation symbols of a particular symbol duration;
regularly estimating the frequency error of the carrier frequency at a receiver end at particular estimation times,
recognizing a useful signal during useful signal detection when a predefined number of differences between two estimated values in each case satisfy a predefined criterion; and
wherein estimated values whose estimation times are temporally separated by a symbol duration or an integer multiple thereof are used to form the differences.

6. The method as claimed in claim 5, wherein two successive estimation times are separated by less than a symbol duration.

7. A system for digitally transmitting data, the system comprising:
- a transmitter emitting, as a useful signal, a sequence of modulation symbols or spreading codes of a particular period and phase angle modulated onto a carrier signal of a particular carrier frequency;
- a receiver for receiving a modulated signal which contains at least one of: a useful signal; noise; and interference signals, the receiver:
    - carrying out repeated estimations of at least one parameter of the received modulated signal relevant to demodulation of the useful signal,
    - monitoring changes in the repeatedly estimated parameters, and
    - identifying the useful signal from the modulated signal based at least in part a criterion being used for detection, according to which criterion useful signal are recognized when one or more changes in the repeatedly estimated parameters satisfy at least one particular, predefined condition;
- wherein the at least one parameter is repeatedly estimated in the receiver at least occasionally in an asynchronous manner with respect to the period of the modulation symbols or spreading codes; and
- the at least one parameter is repeatedly estimated in the receiver with approximately the same period as the period of the modulation symbols or spreading codes, a delay time which corresponds to a change in an estimated phase angle being awaited at least once in a series of estimations of the at least one parameter.

8. The system as claimed in claim 7, wherein at least one frequency error of the carrier frequency at the receiver or the phase angle of the modulation symbols or spreading codes is considered as relevant parameters.

9. The system as claimed in claim 8, wherein the transmitter carries out FSK or GFSK with a (G)FSK symbol duration considerably longer than the period of the modulation symbols or spreading codes.

10. A system for digitally transmitting data, the system comprising:
- a transmitter emitting, as a useful signal, a sequence of modulation symbols or spreading codes of a particular period and phase angle modulated onto a carrier signal of a particular carrier frequency;
- a receiver for receiving a modulated signal which contains at least one of: a useful signal; noise; and interference signals, the receiver:
    - carrying out repeated estimations of at least one parameter of the received modulated signal relevant to demodulation of the useful signal,
    - monitoring changes in the repeatedly estimated parameters, and
    - identifying the useful signal from the modulated signal based at least in part a criterion being used for detection, according to which criterion useful signal are recognized when one or more changes in the repeatedly estimated parameters satisfy at least one particular, predefined condition;
- the useful signal is modulated onto the carrier signal of the particular carrier frequency and the carrier frequency is changed at by the transmitter, and
- the at least one relevant parameter comprises at least one frequency error of the carrier frequency in the received modulated signal, the change in an estimated frequency error at the receiver corresponding to the change in the carrier frequency at the transmitter.

11. The system as claimed in claim 10, wherein:
- the carrier frequency is changed at the transmitter by means of frequency modulation using frequency modulation symbols of a particular symbol duration,
- the frequency error of the carrier frequency is regularly estimated at the receiver end at particular estimation times,
- the useful signal is identified during useful signal detection when a predefined number of differences between two estimated values in each case satisfy a predefined criterion; and
- estimated values whose estimation times are temporally separated by a symbol duration or an integer multiple thereof are used to form the differences.

12. The system as claimed in claim 11, wherein two successive estimation times are separated by less than one symbol duration.

* * * * *